(12) United States Patent
Hirobe

(10) Patent No.: US 8,218,389 B2
(45) Date of Patent: Jul. 10, 2012

(54) SEMICONDUCTOR STORAGE DEVICE AND CONTROL METHOD OF THE SAME

(75) Inventor: Atsunon Hirobe, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 276 days.

(21) Appl. No.: 12/705,544

(22) Filed: Feb. 12, 2010

(65) Prior Publication Data

US 2010/0202233 A1   Aug. 12, 2010

(30) Foreign Application Priority Data

Feb. 12, 2009   (JP) ................... 2009-029365

(51) Int. Cl.
*G11C 7/00*   (2006.01)

(52) U.S. Cl. .................. 365/222; 365/230.06

(58) Field of Classification Search .................. 365/222, 365/230.06
See application file for complete search history.

(56) References Cited

U.S. PATENT DOCUMENTS

| | | | |
|---|---|---|---|
| 6,654,303 B2 | 11/2003 | Miyamoto et al. | |
| 7,061,818 B2 | 6/2006 | Sunaga et al. | |
| 7,652,943 B2 | 1/2010 | Takahashi et al. | |
| 2007/0053235 A1* | 3/2007 | Miyatake ...................... | 365/222 |
| 2008/0225625 A1* | 9/2008 | Parkinson et al. ........ | 365/230.06 |

FOREIGN PATENT DOCUMENTS

| | | |
|---|---|---|
| JP | 2002-298574 | 10/2002 |
| JP | 2003-007054 | 1/2003 |
| JP | 2006-59489 | 3/2006 |

\* cited by examiner

*Primary Examiner* — Michael Tran

(74) *Attorney, Agent, or Firm* — Young & Thompson

(57) ABSTRACT

A semiconductor storage device includes a timing allocation unit that sets refresh timing to preferentially perform a refresh operation for maintaining data and data access timing to preferentially perform a data access operation for reading or writing the data in accordance with a clock signal with respect to each memory bank including a plurality of memory cells, and a waiting unit that waits start of the data access operation until the data access timing is started in a case where a request for the data access operation is made during the refresh timing and waits start of the refresh operation until the refresh timing is started in a case where a request for the refresh operation is made during the data access timing.

14 Claims, 14 Drawing Sheets ized by the address designation means when execution of a
SEMICONDUCTOR STORAGE DEVICE AND CONTROL METHOD OF THE SAME

INCORPORATION BY REFERENCE

This application is based upon and claims the benefit of priority from Japanese patent application No. 2009-029365, filed on Feb. 12, 2009, the disclosure of which is incorporated herein in its entirety by reference.

BACKGROUND

1. Field of the Invention

The present invention relates to a semiconductor storage device and, particularly, to a technique that prevents interference between a refresh operation and a data access operation in pseudo-SRAM (Static Random Access Memory) using DRAM (Dynamic Random Access Memory) cells.

2. Description of Related Art

Pseudo-SRAM in which a memory cell array is composed of DRAM cells that require a refresh operation for maintaining data and made to function as SRAM is widely used today for its advantages of low cost, high capacity and so on. However, pseudo-SRAM has a disadvantage of the lower throughput speed than SRAM. Further, in order to prevent interference between the refresh operation and a normal data access operation such as reading and writing, a means of adjusting the sequence of executing the both operations is necessary for pseudo-SRAM. If there is an error in the adjustment, a memory bank on which the data access operation is concentrated is not sufficiently refreshed, for example, which can cause the occurrence of a malfunction such as data loss.

Related arts related to pseudo-SRAM are described hereinbelow. Japanese Unexamined Patent Application Publication No. 2003-7054 discloses a semiconductor storage device including one timer means that measures data maintain limit time of a memory cell, a storage circuit that stores refresh information indicating being refreshed for each memory bank, a refresh address designation means that designates a refresh address in a memory bank, and a refresh control means that controls a refresh operation on each memory bank according to the designated refresh address and also detects an unrefreshed memory bank from refresh information and makes control to refresh the detected memory bank for every data maintain limit time.

Further, Japanese Unexamined Patent Application Publication No. 2006-59489 discloses a semiconductor storage device including a control circuit that makes control so that a refresh operation is performed just before a read/write operation (normal data access operation) and latency is always set to a first fixed value in the first mode, and the refresh operation is performed just after the read/write operation and latency is always set to a second fixed value in the second mode during test.

Furthermore, Japanese Unexamined Patent Application Publication No. 2002-298574 discloses DRAM including an execution instruction means that instructs execution of a refresh, an address designation means that designates a row address of a memory cell to be refreshed, and an execution means that refreshes a memory cell at a row address designated by the address designation means when execution of a refresh is instructed from the execution instruction means.

SUMMARY

However, in the semiconductor storage device disclosed in Japanese Unexamined Patent Application Publication No. 2003-7054, the operation that detects an unrefreshed memory bank from refresh information and refreshes the detected memory bank serves as a factor to inhibit high-speed operation. Further, because the data access operation and the refresh operation are performed on different memory banks, if the data access operation is concentrated on a particular memory bank, a case can occur where the memory bank is not refreshed, and it is therefore necessary to impose limits on the data access operation.

Further, the semiconductor storage device disclosed in Japanese Unexamined Patent Application Publication No. 2006-59489 includes a means of allowing timing to execute the refresh operation and timing to execute the data access (read/write) operation to occur close to each other, and there is room for improvement on aspects such as accurately adjusting the sequence of executing the both operations and increasing the throughput speed.

In addition, the structure disclosed in Japanese Unexamined Patent Application Publication No. 2002-298574 includes a means of performing a normal access and a refresh one by one in one operation cycle of SRAM, and it does not contribute to improvement on aspects such as accurately adjusting the sequence of executing the both operations and increasing the throughput speed.

A first exemplary aspect of an embodiment of the present invention is a semiconductor storage device that includes a timing allocation unit that sets refresh timing to preferentially perform a refresh operation for maintaining data and data access timing to preferentially perform a data access operation for reading or writing the data in accordance with a clock signal with respect to each memory bank including a plurality of memory cells, and a waiting unit that waits start of the data access operation until the data access timing is started in a case where a request for the data access operation is made during the refresh timing and waits start of the refresh operation until the refresh timing is started in a case where a request for the refresh operation is made during the data access timing.

According to the above exemplary aspect, a priority period for the refresh operation (refresh timing) and a priority period for the data access operation (data access timing) are set in accordance with the clock signal with respect to each data bank. Then, the refresh operation and the data access operation wait until reaching their respective priority periods. It is thereby possible to accurately prevent a malfunction due to coincidence of the refresh request and the data access request from a CPU. Further, this eliminates the need for processing such as checking a refresh execution state of each memory bank, and it is thereby possible to improve the throughput speed.

A second exemplary aspect of an embodiment of the present invention is a control method of a semiconductor storage device that includes setting refresh timing to preferentially perform a refresh operation for maintaining data and data access timing to preferentially perform a data access operation for reading or writing the data in accordance with a clock signal with respect to each memory bank including a plurality of memory cells, waiting start of the data access operation until the data access timing is started in a case where a request for the data access operation is made during the refresh timing, and waiting start of the refresh operation until the refresh timing is started in a case where a request for the refresh operation is made during the data access timing.

The above method is on the basis of the same technical idea as that of the above-described device, and its operational advantage is the same as that of the above-described device.

As described above, according to the exemplary aspects of an embodiment of the present invention described above, it is possible to efficiently adjust the sequence of executing the refresh operation and the data access operation with respect to each memory bank. It is thereby possible to reliably prevent a malfunction due to interference between the refresh operation and the data access operation without causing degradation of the throughput speed.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
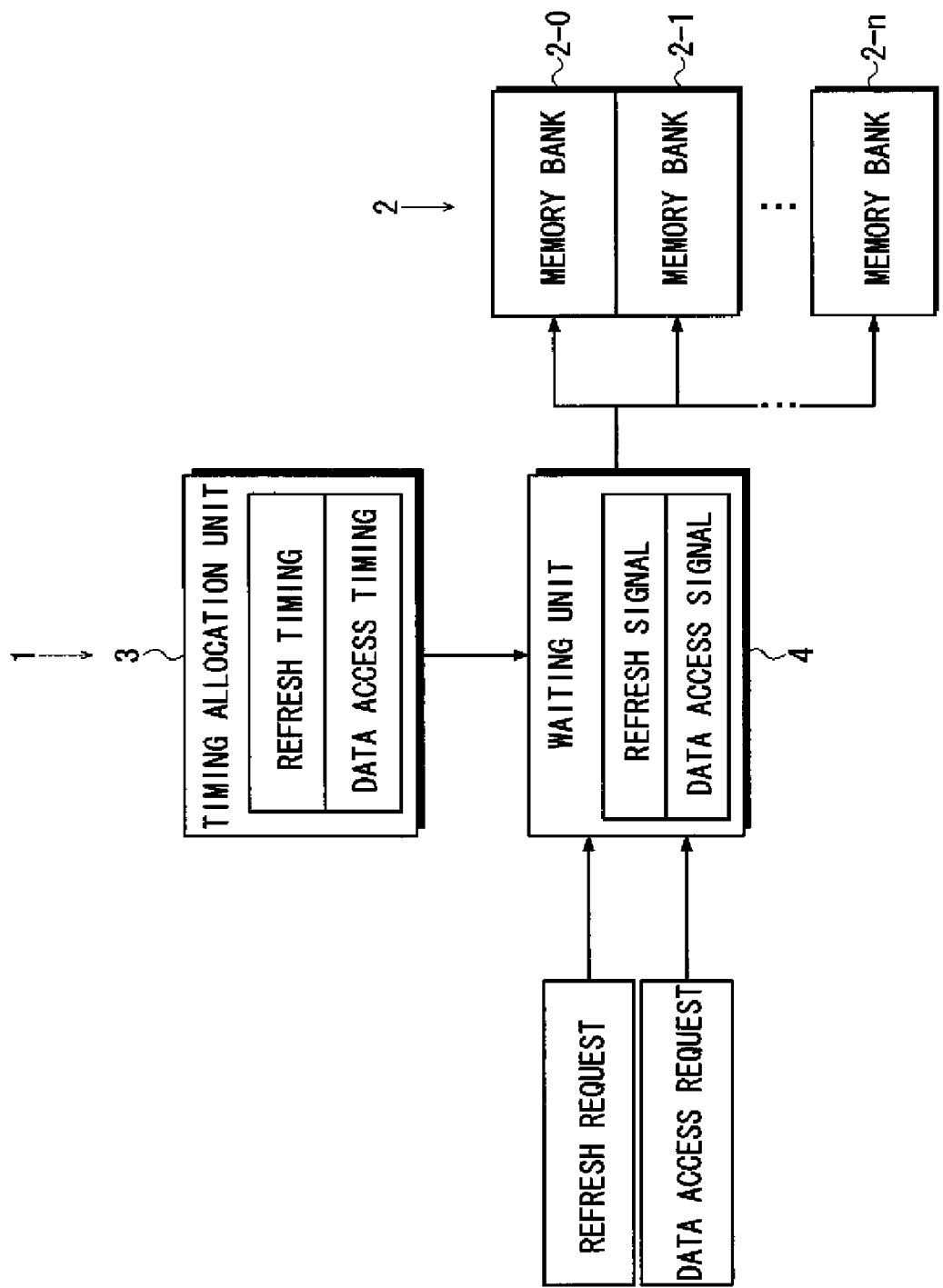
FIG. 1 is a block diagram showing a functional configuration of a semiconductor storage device according to an exemplary embodiment of the present invention.

An exemplary embodiment of the present invention is described hereinafter with reference to the drawings. FIG. 1 shows a functional configuration of a semiconductor storage device 1. The semiconductor storage device 1 is a pseudo-SRAM using DRAM cells, and it includes a memory bank 2, a timing allocation unit 3 and a waiting unit 4.

The memory bank 2 is an access unit that is composed of a plurality of memory cells. Each of the memory cells has a DRAM configuration that requires a refresh operation to maintain data. A whole memory cell array is made up of a plurality of memory banks 2-0, 2-1 . . . and 2-n. The refresh operation and a data access operation for data writing/reading are performed on each of the memory banks 2-0, 2-1, . . . and 2-n in response to a request signal from a CPU (including an external system), which is not shown.

The timing allocation unit 3 sets refresh timing to preferentially perform the refresh operation and data access timing to preferentially perform the data access operation on each of the memory banks 2-0, 2-1, . . . and 2-n in accordance with a given clock signal. The timing allocation unit 3 may be implemented by a hardware configuration having a combination of an oscillator circuit and another logic circuit or a software configuration including a processor, a control program or the like.

When a request for the data access operation is made to one of the memory bank 2 during the refresh timing which is set by the timing allocation unit 3, the waiting unit 4 waits start of the data access operation until the data access timing is started. On the other hand, when a request for the refresh operation is made to one of the memory bank 2 during the data access timing which is set by the timing allocation unit 3, the waiting unit 4 waits start of the refresh operation until the refresh timing is started. The waiting unit 4 may be implemented by a hardware configuration or a software configuration.

Figure 2:
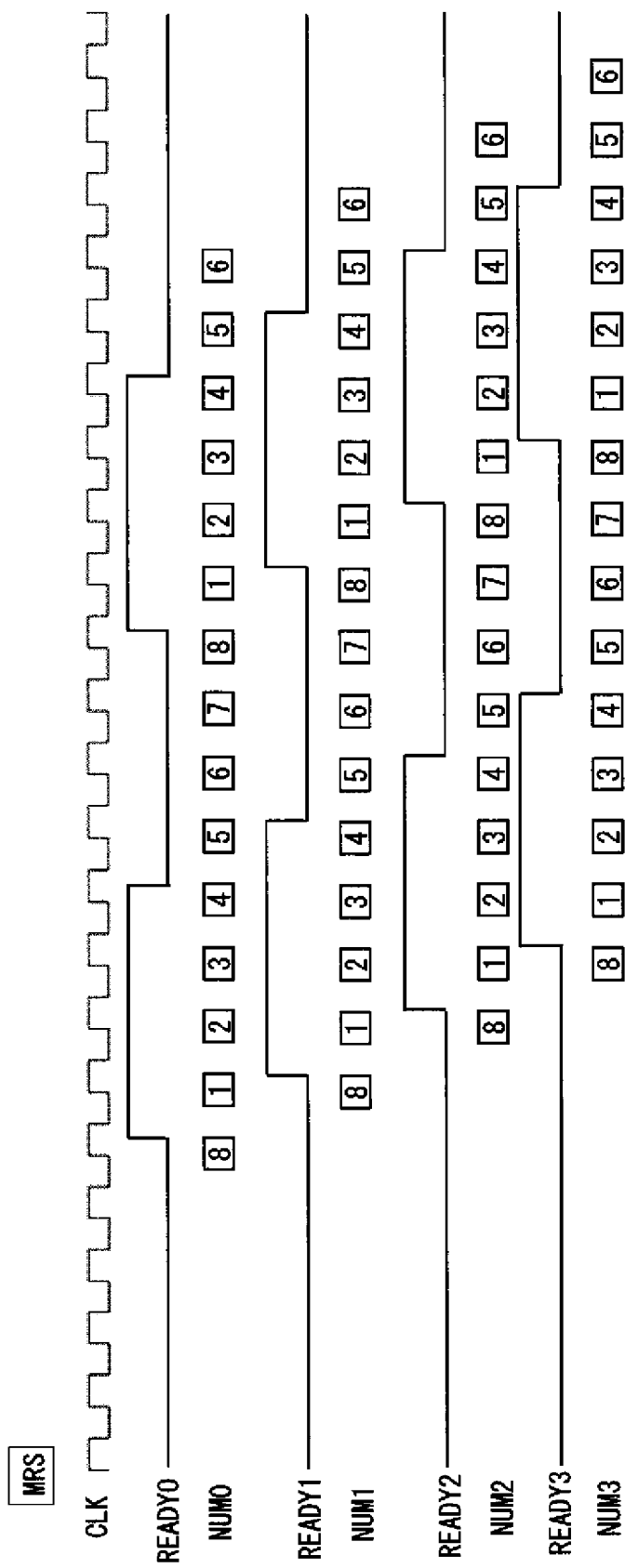
FIG. 2 is a view showing a basic concept of a method of allocating refresh timing and data access timing.

FIG. 2 shows a basic concept of a method of allocating the refresh timing and the data access timing by the timing allocation unit 3. In FIG. 2, a clock signal CLK, timing control signals READY 0 to 3 and numberings NUM 0 to 3 are shown. The clock signal CLK is originated from a predetermined originating circuit and serves as a reference. A case where the memory bank 2 includes four memory banks 2-0, 2-1, 2-2 and 2-3 is described below by way of illustration. MRS (Mode Register Signal) indicates the input timing of a mode register that sets an operating mode.

The timing control signals READY 0 to 3 are signals that determine the refresh timing and the data access timing, which respectively correspond to the memory banks 2-0, 2-1, 2-2 and 2-3. A period when the respective timing control signals READY 0 to 3 are H is the refresh timing during which priority is given to the refresh operation, and a period when the respective timing control signals READY 0 to 3 are L is the data access timing during which priority is given to the data access operation.

The numberings NUM 0 to 3 define the relationship between the respective timing control signals READY 0 to 3 and the edge position of the clock signal CLK. The numberings NUM 0 to 3 repeatedly allocate numbers 1 to 8 at each edge of the clock signal CLK. In this exemplary embodiment, the respective numbers 1 to 8 are shifted one clock each among the numberings NUM 0 to 3. Further, in this exemplary embodiment, the period of clock edges corresponding to the numbers 1 to 4 is defined so that the timing control signals READY 0 to 3 are H, which is the refresh timing. Further, the period of clock edges corresponding to the numbers 5 to 8 is defined so that the timing control signals READY 0 to 3 are H, which is the data access timing.

For example, in a case where the data access request is made at the same time as the refresh request at the clock edge corresponding to the number 1, a signal related to the data access request is set to the wait state until the clock edge corresponding to the number 5, i.e., for four clocks. Further, in a case where the refresh request is made at the clock edge corresponding to the number 1 and the data access request is made at the clock edge corresponding to the number 2, a signal related to the data access request is set to the wait state for three clocks. Cases where the refresh request is made in the timing of the numbers 2 to 4 are described later.

The refresh request which is made in the period corresponding to the numbers 5 to 8, which is the data access timing, is disabled. Further, in a case where the data access request is made in the period corresponding to the numbers 5 to 8 and the data access operation is not completed until the clock edge corresponding to the number 1 is reached, i.e., until the refresh timing is restarted, a signal related to the refresh request is set to the wait state until the data access operation is completed.

By scheduling the refresh timing and the data access timing so as to correspond to the clock signal CLK in advance for each of the memory banks 2-0, 2-1, . . . and 2-n as described above, it is possible to prevent interference of the data access request whose input timing is indeterminate in random access memory with the refresh request.

Further, by determining the priority of operations (whether refresh or data access) with use of the timing control signals READY 0 to 3, it is possible to determine the internal operation mode in advance by tracing back to a cycle before the clock edge at which the refresh request is actually made (or before that time).

Although the number sequence of the numberings NUM 0 to 3 ranges from 1 to 8, the timing control signals READY 0 to 3 are set to H every eight clocks, and the refresh timing is started from the clock edge with the number 1 in the above-described example, whether or not to set the signals to H every eight clocks should be appropriately changed based on the hold capacity of the memory cell, system requirements consistent therewith and so on.

Further, the starting point of MRS may be a signal related to initiation of the internal operation such as a power-on detection signal upon power-up, a set signal of PLL (Phase Locked Loop) or an external reset signal.

Figure 3:
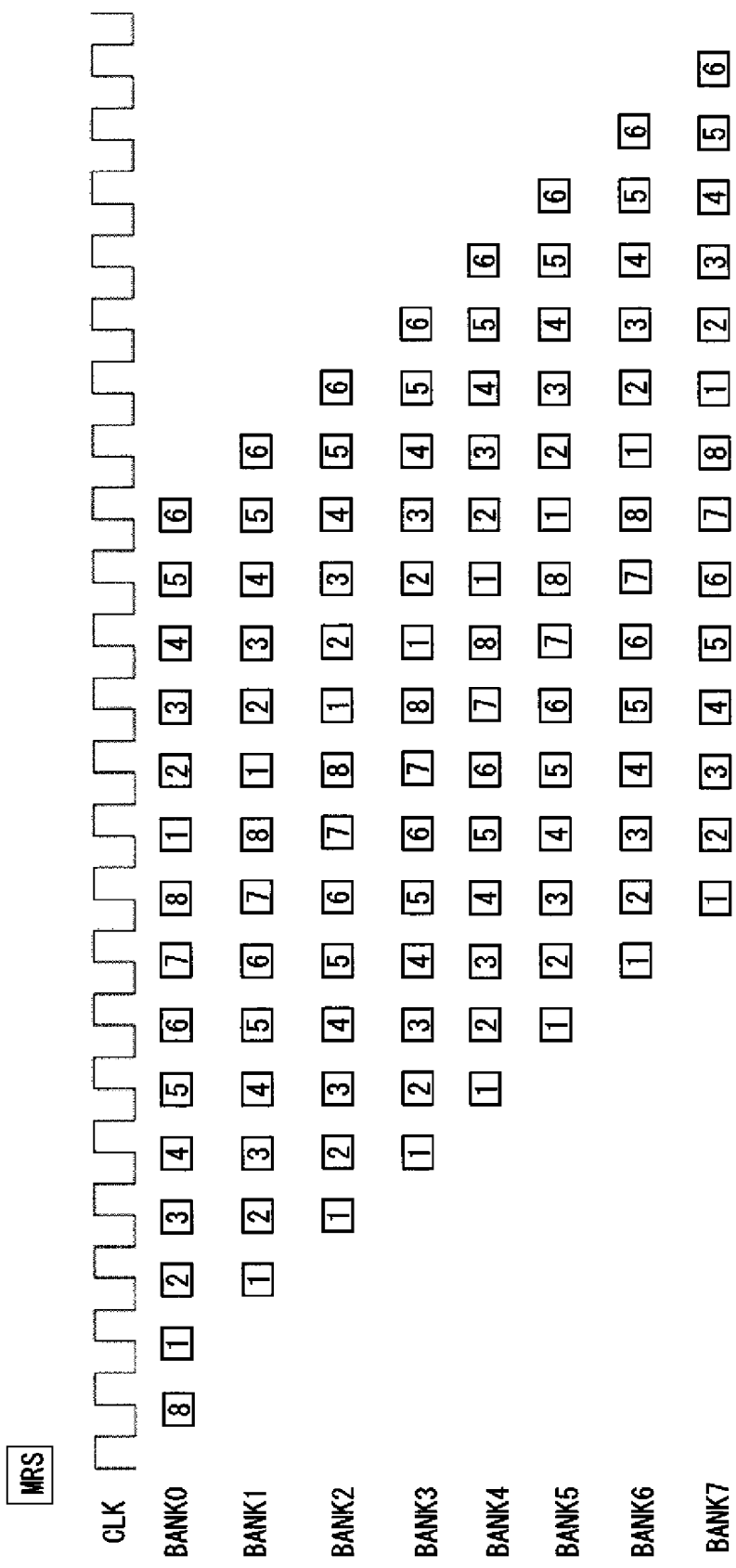
FIG. 3 is a view illustrating a state where numbering is made on a clock signal in memory including eight memory banks.

FIG. 3 illustrates a state where numbering is made on the clock signal CLK in synchronous memory that includes eight memory banks BANK 0 to 7 (2-0, 2-1, . . . and 2-7 in FIG. 1).

Figure 4:
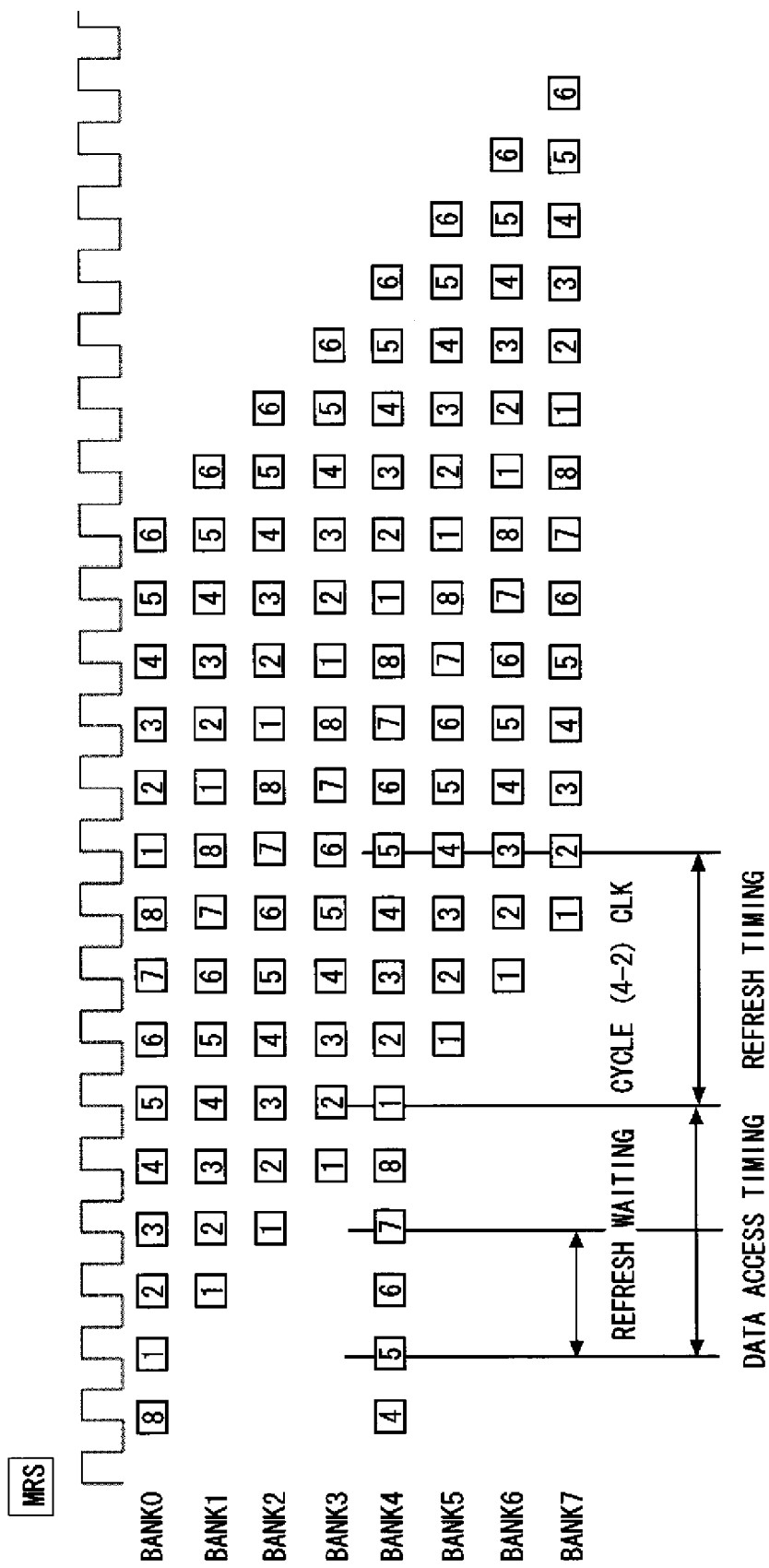
FIG. 4 is a view to describe one procedure of a basic operation, focusing attention on one of the eight memory banks shown in FIG. 3.

FIG. 4 is a view to describe one procedure of a basic operation, focusing attention on the fifth memory bank BANK4 of the eight memory banks BANK 0 to 7 shown in FIG. 3. The period of the numbers 1 to 4 is the refresh timing when priority is given to the refresh operation, and the period of the numbers 5 to 8 is the data access timing when priority is given to the data access operation. FIG. 4 shows a case where the data access request is made at the clock edge corresponding to the number 7. In this case, two clocks have elapsed from the clock edge corresponding to the number 5 which serves as a reference of the start of the data access timing, and the two clocks are stored as the wait time to be used later. Then, if the refresh request is made at the clock edge corresponding to the number 1 which serves as a reference of the start of the refresh timing, a signal related to the refresh request is made to wait for two clocks based on the stored wait time. Further, when the refresh request is not made (NOP: No Operation), the stored wait time is one clock. The same applies to the data access request in the data access timing.

Figure 5:
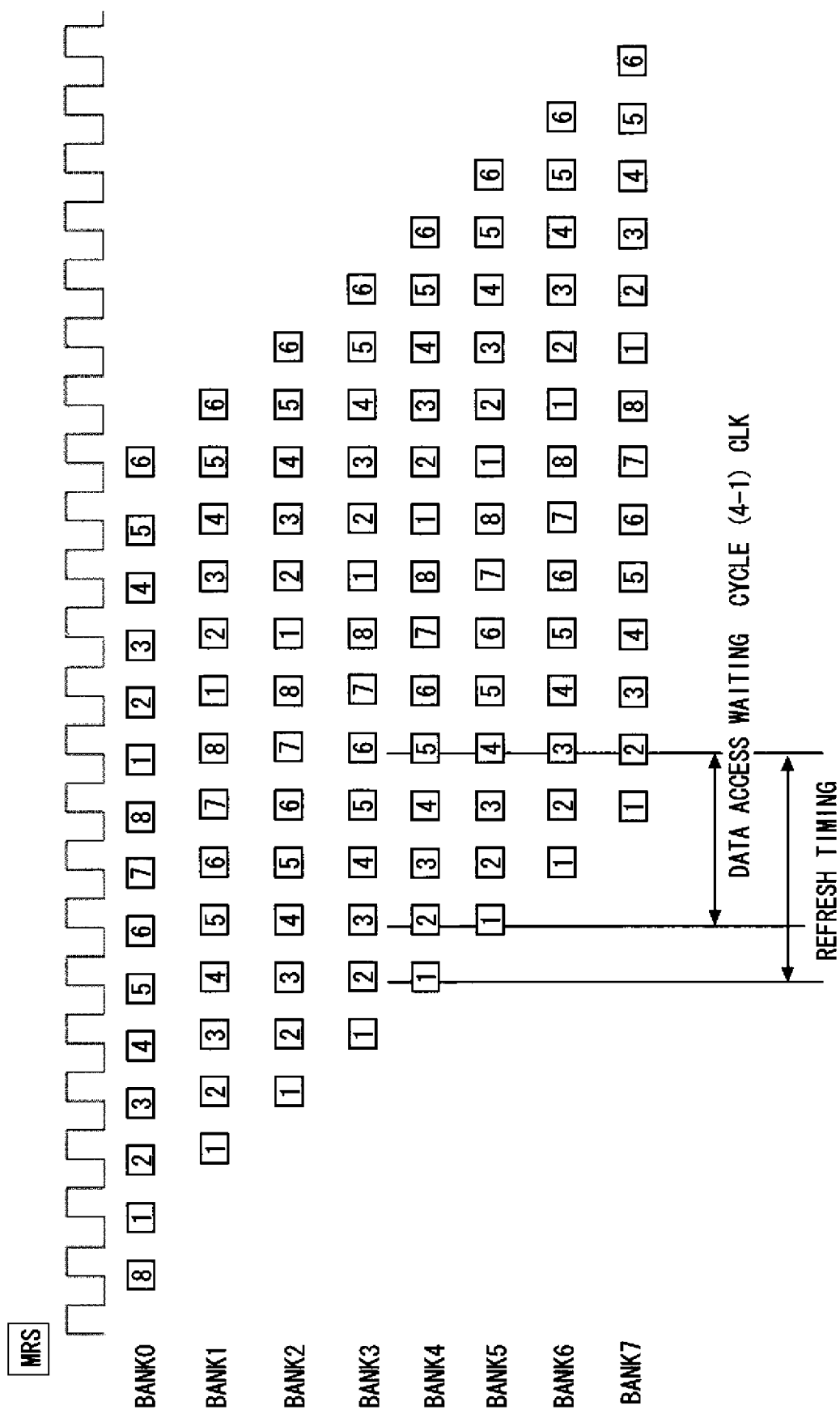
FIG. 5 is a view showing an operation when a data access request is made at a clock edge corresponding to a number 2.

FIG. 5 shows a case where the data access request is made at the clock edge corresponding to the number 2 (during the refresh timing). In this case, if the refresh request has been made at the clock edge corresponding to the number 1, the data access request waits for three clocks as the wait time until the clock edge corresponding to the number 5.

Figure 6:
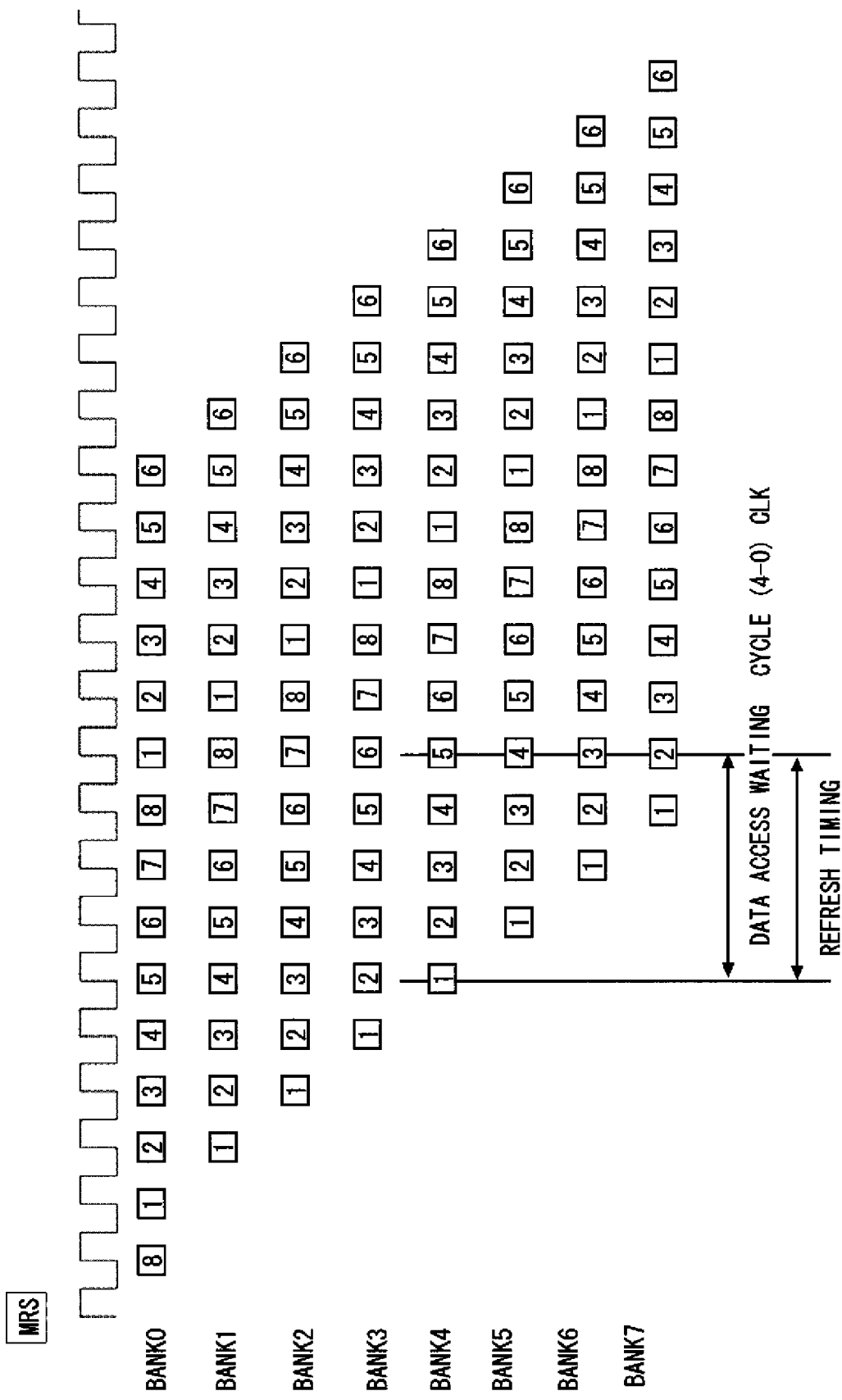
FIG. 6 is an operation in a case where both a refresh request and a data access request are made at a clock edge corresponding to a number 1.

FIG. 6 shows a case where the refresh request and the data access request are made at the clock edge corresponding to the number 1. In this case, the operation is basically the same as shown in FIG. 5 described earlier.

Figure 7:
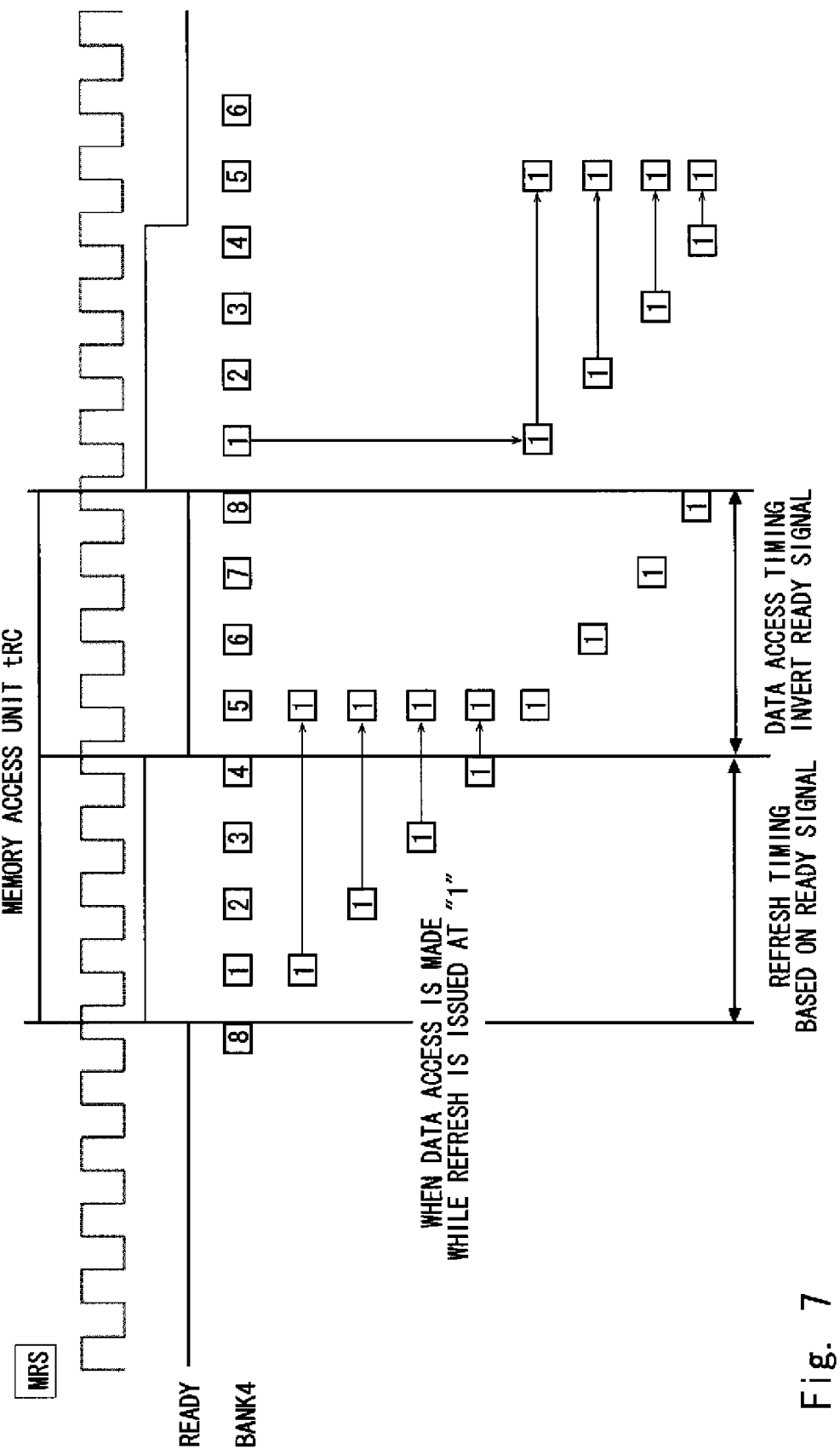
FIG. 7 is a view collectively representing operations shown in FIGS. 4 to 6, focusing attention on one memory bank.

FIG. 7 collectively shows the operations in FIGS. 4 to 6, focusing attention on the memory bank BANK4. In FIG. 7, memory access time tRC is shown. Also shown is the wait time when the refresh request is made at the clock edge corresponding to the number 1 and when the data access request is made at the clock edges corresponding to the numbers 1 to 8.

Figure 8:
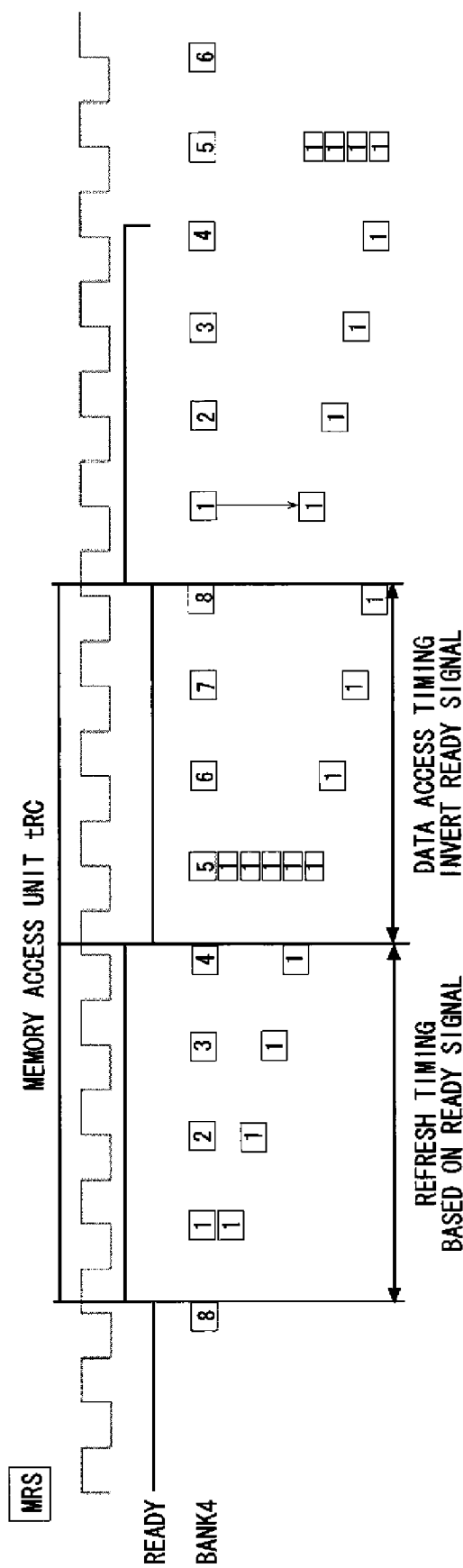
FIG. 8 is a view showing an operation in a case where a clock signal cycle is twice as long as that of the clock signal shown in FIG. 7.

FIG. 8 shows a case where a cycle tCK of the clock signal CLK is twice as long as that of the clock signal CLK shown in FIG. 7. In this example, the memory access time tRC depends on the cycle tCK, and an operation is scheduled by the clock edge, not according to the cycle tCK. The refresh request is made on the basis of the clock edge corresponding to the number 1. Thus, when the numbering ranges from number 1 to 8 as described above, the refresh request is made once every eight clock cycles. Whether or not to make the refresh request once every eight clock cycles is determined based on the hold capacity of the memory cell, system requirements consistent therewith and so on.

In this exemplary embodiment, the clock edge at which the refresh request is made (corresponding to the number 1) is one in each memory access time tRC, and tRC=n*tCK where n=8. The value of n is a positive number which is appropriately selected according to the memory capacity.

The refresh request to each memory bank 2 is requested at m*tRC. Although the request frequency is determined based on an internal timer, a previously performed frequency determination result, a PW result, preset conditions or the like, an operation based on the numbering NUM as described above is performed for a signal related to the actual refresh request.

Further, the internal operation is previously switched according to the state of the timing control signal READY. The H period and the L period of the timing control signal READY are allocated within the memory access time tRC.

Figure 9:
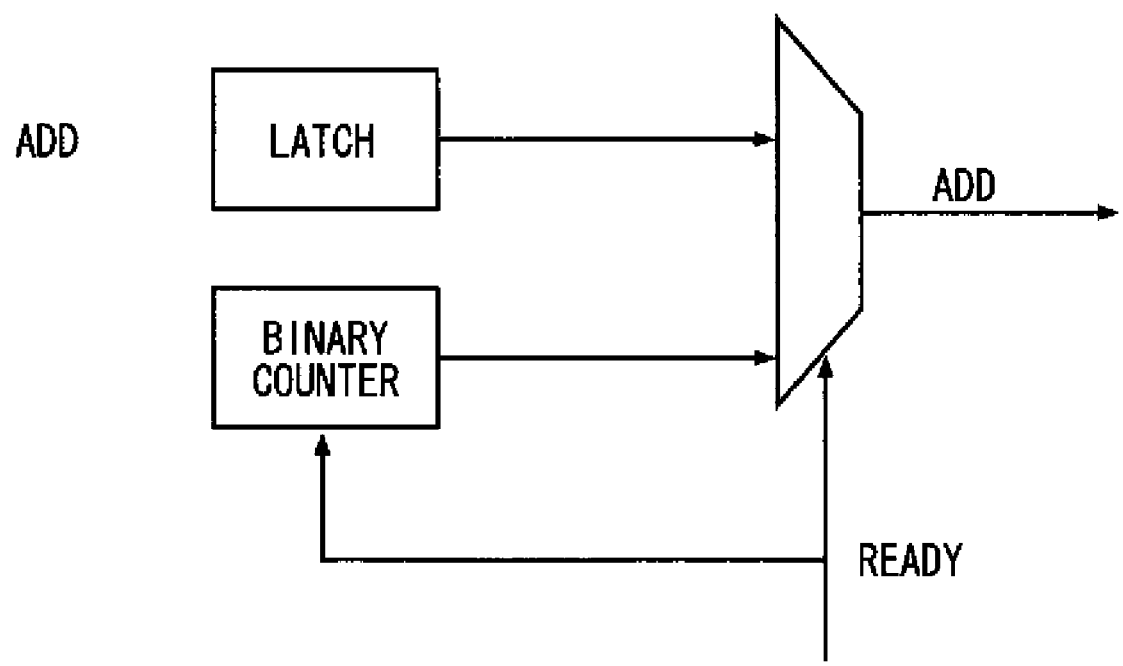
FIG. 9 is a view illustrating a structure that implements address selection based on a timing control signal.

FIG. 9 illustrates a case where address selection is performed based on the timing control signal READY. In FIG. 9, ADD is an address signal for each memory bank 2, and it is defined before actual data access or refresh by using the timing control signal READY as an access path.

The frequency of the refresh request can be expanded as follows:

$$tRC=n*tCK, n=8$$

$$m*tRC (\text{refresh on each memory bank})$$

$$n'<n$$

The timing control signal READY at m*(n+n') makes the actual refresh request when there is a timer request to the clock signal CLK. A timer that issues the timer request may be an analog timer with a temperature sensor, a digital timer including a frequency determination function and a clock counter or the like. Further, instead of using the timer, m may be set as a definition of an external command.

$$tRC=n*tCK, n=8 (\text{the exemplary embodiment})$$

$$m*tRC (\text{refresh on each memory bank})$$

By the external command, m*(n+n') where n'<n at which the timing control signal READY is issued is determined. The external command may be directly or indirectly input for m.

Although the frequency of the refresh request can be determined as described above, a change in manufacturing process or testing process may be made.

$$tRC=n*tCK, n=8$$

$m*tRC$(refresh on each memory bank)

$m*(n+n')$ where $n'<n$ at which the timing control signal READY is issued is determined by a wiring layer, a fuse in the manufacturing process or the like. Further, it may be changed by using the test mode.

$$tRC=n*tCK, n=8 \text{(the exemplary embodiment)}$$

$m*tRC$(refresh on each memory bank)

$m*(n+n')$ where $n'<n$ at which the timing control signal READY is issued can be switched in the test mode.

Figure 10:
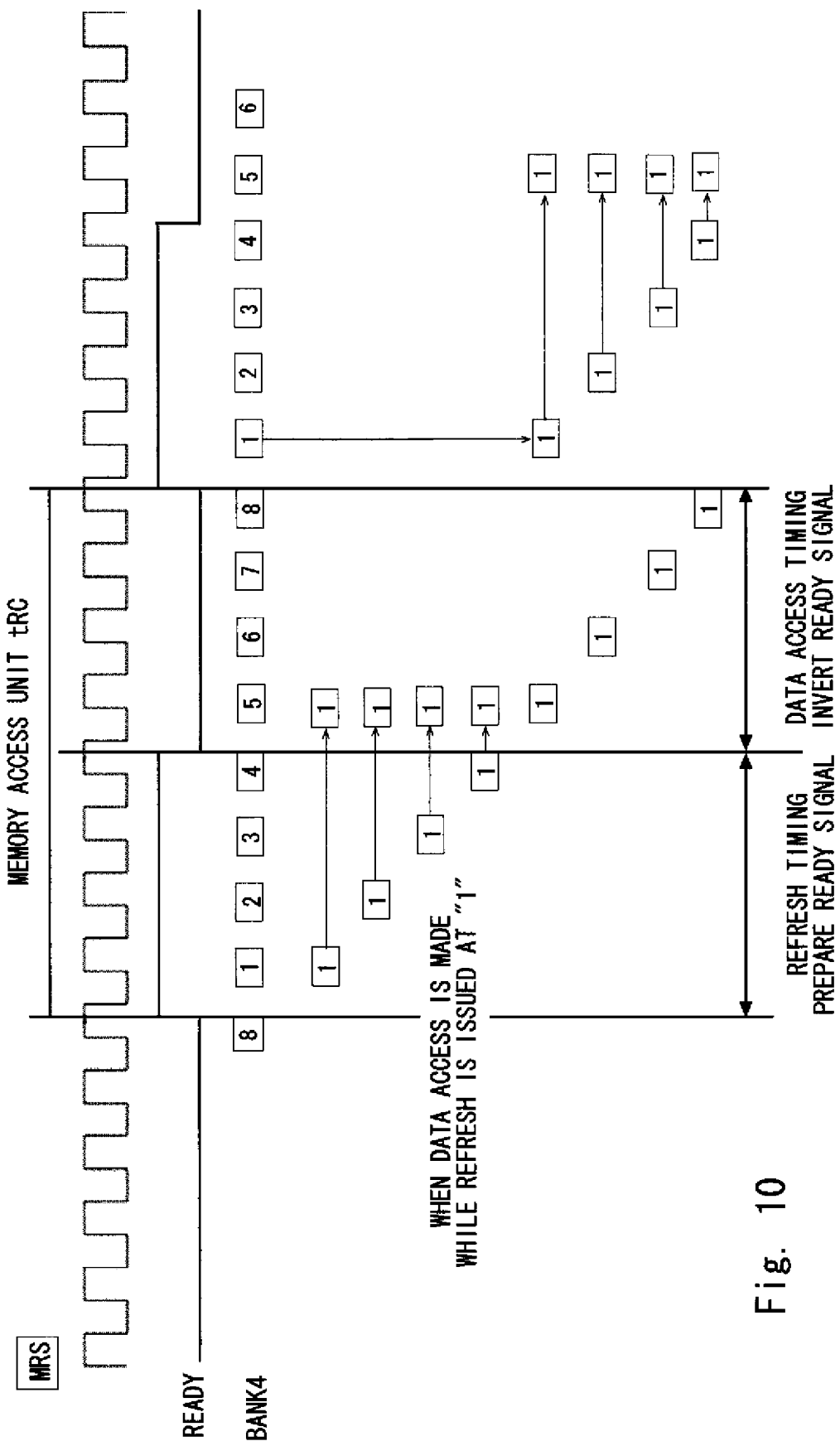
FIG. 10 is a view showing a setting state of wait time until a clock edge corresponding to a number 5 in a case where a refresh request is made at a clock edge corresponding to a number 1 and a data access request is made at clock edges corresponding to numbers 1 to 4.

Scheduling in the wait state is described hereinbelow. FIG. 10 shows a setting state of the wait time until the clock edge corresponding to the number 5 in a case where the refresh request is made at the clock edge corresponding to the number 1 of the above-described numbering and the data access request is made at the clock edges corresponding to the numbers 1 to 4. When a data access is made to the memory bank BANK4 in each memory access time tRC, the wait time of the memory bank BANK4 remains the same. On the other hand, when the memory access time tRC ends and the NOP clock is generated on the memory bank BANK4, the wait time of the memory bank BANK4 is time after the number of times when NOP has occurred is subtracted therefrom.

Figure 11:
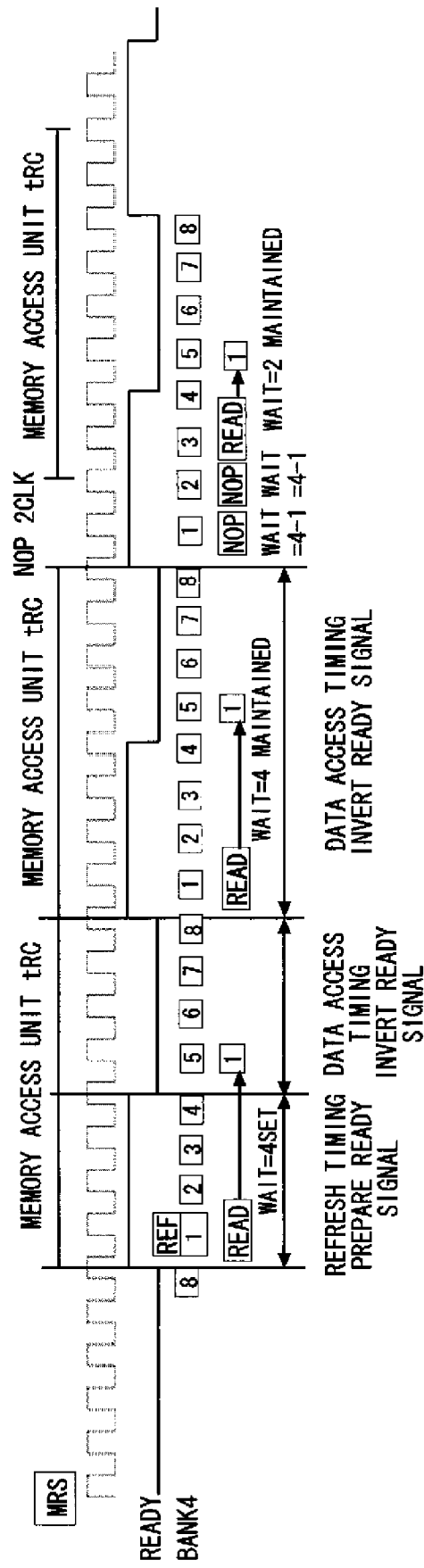
FIG. 11 is a view showing a setting state of wait time in a case where a refresh request and a data access request are made during a reference clock of refresh timing.

FIG. 11 shows a setting state of the wait time in a case where the refresh request and the data access request are made during a reference clock of the refresh timing. In this case, the wait time is set for the period of four clocks. Next, after the memory access time tRC has elapsed, the data access request is made. At this time, the wait time maintains four clocks. Then, after the memory access time tRC has elapsed, NOP occurs two times in a row, and thus the wait time is for two (4−2) clocks.

Figure 12:
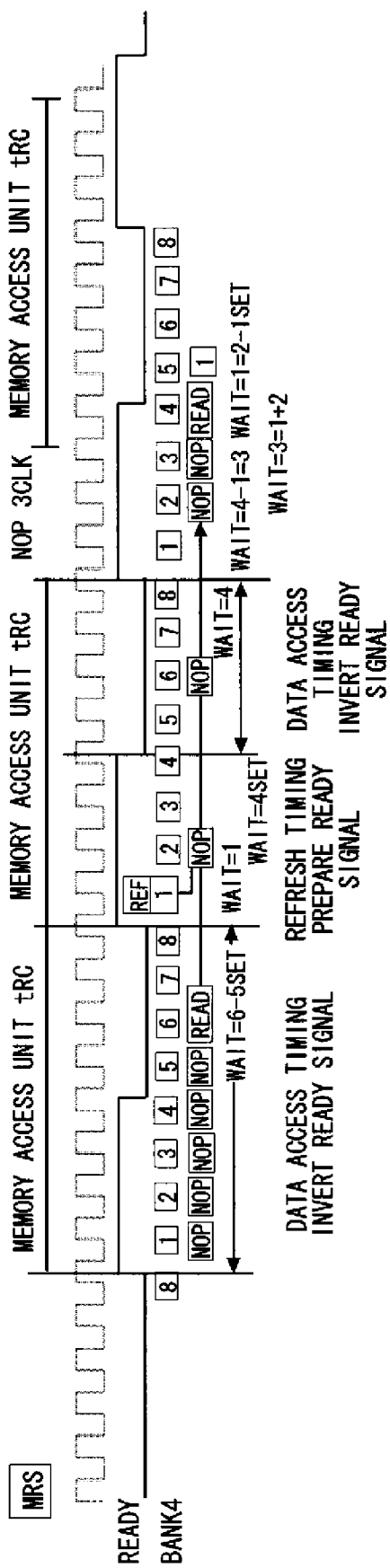
FIG. 12 is a view showing a setting state of wait time in a case where a data access request is made during an idle period.

FIG. 12 shows a setting state of the wait time in a case where the data access request is made during an idle period (successive NOP). When the refresh request is made, even if the data access request is made subsequently, the data access request is made to wait for the wait time of one clock to give priority to the refresh request. At this time, the wait time is held for four clocks (until the previous wait time becomes zero). After the operation according to the refresh request having priority, the held wait time of four clocks is then set for the data access request.

Figure 13:
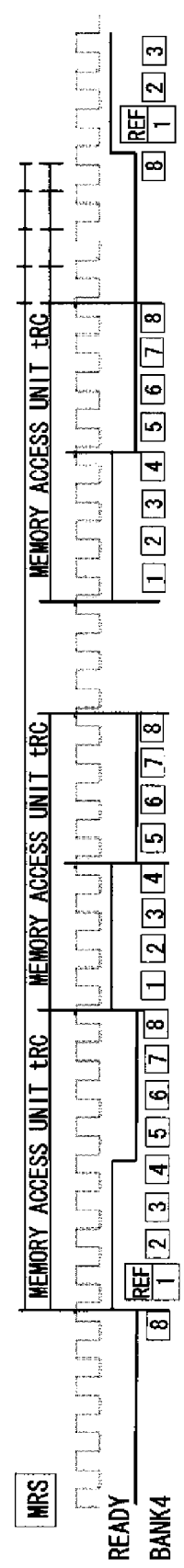
FIG. 13 is a view representing a case where a data access request made during a cycle before a refresh request continues into the refresh request.

FIG. 13 shows a case where the data access request which is made during a cycle before the refresh request continues into the refresh request.

Figure 14:
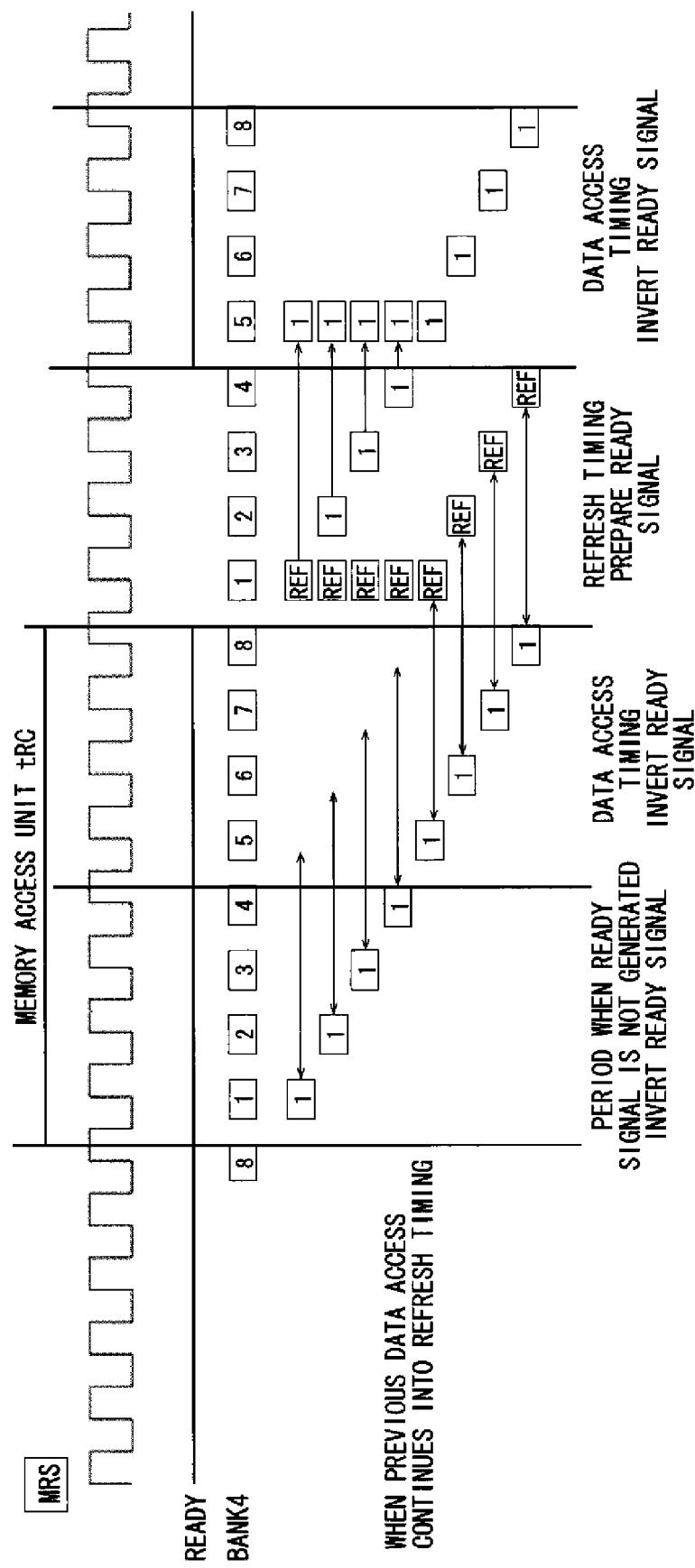
FIG. 14 is a view representing a resolution for hold based on an arithmetic expression to determine a reference clock for a refresh request.

FIG. 14 represents a resolution for hold based on the following arithmetic expression that determines a reference clock for making the refresh request in actual operation.

$$tRC=n*tCK, n=8$$

$m*tRC$(refresh on the memory bank)

$m*(n+n'), n'<n$

By determining m and n' using the above-described timer or the like, it is possible to determine a resolution for hold.

According to the above-described configuration, it is possible to prevent a malfunction due to mutual interference between the refresh operation and the data access operation without causing degradation of the throughput speed. This is because the above-described configuration does not require processing such as storing refresh information indicating that refresh is performed on each memory bank and detecting the unrefreshed memory bank based on the information. It is thereby possible to enhance the speed of the pseudo-SRAM.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor storage device comprising:
    a timing allocation unit that sets refresh timing to perform a refresh operation for maintaining data and data access timing to perform a data access operation for reading or writing the data in accordance with a clock signal with respect to each memory bank including a plurality of memory cells; and
    a waiting unit that waits start of the data access operation until the data access timing is started in a case where a request for the data access operation is made during the refresh timing, and waits start of the refresh operation until the refresh timing is started in a case where a request for the refresh operation is made during the data access timing,
    wherein the semiconductor storage device is configured so that a clock edge at which the request for the refresh operation is made according to $$tRC=n*tCK$$

where tRC is a memory access time, tCK is a clock cycle and n is a positive number selected in accordance with memory capacity.

2. The semiconductor storage device according to claim 1, wherein the refresh timing and the data access timing are respectively set in such a way that periods equivalent to a plurality of edges of the clock signal are repeated alternately.

3. A control method of a semiconductor storage device comprising:
    setting refresh timing to perform a refresh operation for maintaining data and data access timing to perform a data access operation for reading or writing the data in accordance with a clock signal with respect to each memory bank including a plurality of memory cells;
    waiting start of the data access operation until the data access timing is started in a case where a request for the data access operation is made during the refresh timing; and
    waiting start of the refresh operation until the refresh timing is started in a case where a request for the refresh operation is made during the data access timing,
    wherein a clock edge at which the request for the refresh operation is made according to $$tRC=n*tCK$$

where tRC is a memory access time, tCK is a clock cycle and n is a positive number selected in accordance with memory capacity.

4. The control method of a semiconductor storage device according to claim 3, wherein the refresh timing and the data access timing are respectively set in such a way that time periods equivalent to a plurality of edges are repeated alternately.

5. The semiconductor storage device according to claim 1, wherein n=8.

6. The control method of a semiconductor storage device according to claim 3, wherein n=8.

7. The semiconductor storage device according to claim 1, wherein the refresh request to each memory bank is requested at m*tRC, where m is set by a timer.

8. The control method of a semiconductor storage device according to claim 3, wherein the refresh request to each memory bank is requested at m*tRC, where m is set by a timer.

9. The semiconductor storage device according to claim 7, wherein a timing control signal READY at m*(n+n') makes the actual refresh request when there is a timer request to the clock signal.

10. The control method of a semiconductor storage device according to claim 8, wherein a timing control signal READY at m*(n+n') makes the actual refresh request when there is a timer request to the clock signal.

11. The semiconductor storage device according to claim 1, wherein the refresh request to each memory bank is requested at m*tRC, where m is set by an external command.

12. The control method of a semiconductor storage device according to claim 3, wherein the refresh request to each memory bank is requested at m*tRC, where m is set by an external command.

13. The semiconductor storage device according to claim 1, wherein the refresh request to each memory bank is requested at m*tRC, where m is set by a timer, and
 m*(n+n') where n'<n determines when a timing control signal READY is issued.

14. The control method of a semiconductor storage device according to claim 3, wherein the refresh request to each memory bank is requested at m*tRC, where m is set by a timer, and
 m*(n+n') where n'<n determines when a timing control signal READY is issued.

* * * * *

UNITED STATES PATENT AND TRADEMARK OFFICE
CERTIFICATE OF CORRECTION

PATENT NO. : 8,218,389 B2
APPLICATION NO. : 12/705544
DATED : July 10, 2012
INVENTOR(S) : Atsunori Hirobe It is certified that error appears in the above-identified patent and that said Letters Patent is hereby corrected as shown below:

On the Title page, left column:

"(75)   Inventor: Atsunon Hirobe, Kanagawa, JP"

should be replaced with:

--(75)   Inventor: Atsunori Hirobe, Kanagawa, JP--

Signed and Sealed this
Twenty-eighth Day of May, 2013

Teresa Stanek Rea
*Acting Director of the United States Patent and Trademark Office*